United States Patent [19]
Martin

[11] Patent Number: 5,113,785
[45] Date of Patent: May 19, 1992

[54] TRANSPORT DEVICE FOR BOARDS, ESPECIALLY THOSE HAVING A SENSITIVE SURFACE

[75] Inventor: Peter Martin, Basel, Switzerland

[73] Assignee: Ciba-Geigy Corporation, Ardsley, N.Y.

[21] Appl. No.: 590,902

[22] Filed: Oct. 1, 1990

[30] Foreign Application Priority Data

Oct. 6, 1989 [CH] Switzerland ............ 3650/89

[51] Int. Cl.⁵ ............................................. B05C 1/02
[52] U.S. Cl. ............................. 118/58; 118/324; 118/500; 118/DIG. 4; 198/803.14
[58] Field of Search .............. 118/58, 301, 322, 324, 118/677, DIG. 4, 423, 428, 500; 198/483.1, 803.14, 803.15

[56] References Cited
U.S. PATENT DOCUMENTS 4,757,892  7/1988  Wenger ........................ 198/404
4,926,789  5/1990  Wenger et al. .............. 118/668

FOREIGN PATENT DOCUMENTS 2439734  5/1980  France.

Primary Examiner—Kenneth M. Schor
Assistant Examiner—Charles K. Friedman
Attorney, Agent, or Firm—Luther A. R. Hall; Harry Falber

[57] ABSTRACT

A transport device (1) for boards (2) or board-shaped workpieces, especially those having a sensitive surface, preferably for circuit boards which are coated with plastics material, for example UV-hardenable plastics material, with lacquer or the like and then dried, is constructed as a circulating coating system. The device (1) has holders (3) for taking hold of the boards (2) at the edges (2a) thereof when they are being handled, and advancing means, advantageously in the form of chains, for transporting those holders (3). The holder (3) has two parallel bars (10) on each of which there are provided two rows (11, 12) of prongs (13) arranged in the form of a rake, the prongs (13) of the one row (11) of a bar (10) forming an acute angle with those of the second row (12) of that bar (10) and the two rows (11, 12) accordingly being arranged with respect to each other in a "V" shape when viewed in cross-section. The free ends of the prongs (13) of the one bar (10) point towards the free ends of the prongs (13) of the other bar (10). The two bars (10) extend from a common carrier (14) which holds and connects them, on which carrier there is provided at the end from which the bars (10) extend an end-face stop (15) for the boards (2) which has two limbs (15a, 15b) extending at an obtuse angle to each other towards the bars (10), so that a rectangular board being supported abuts only by the corners that are towards that stop (15) (FIG. 1).

38 Claims, 11 Drawing Sheets

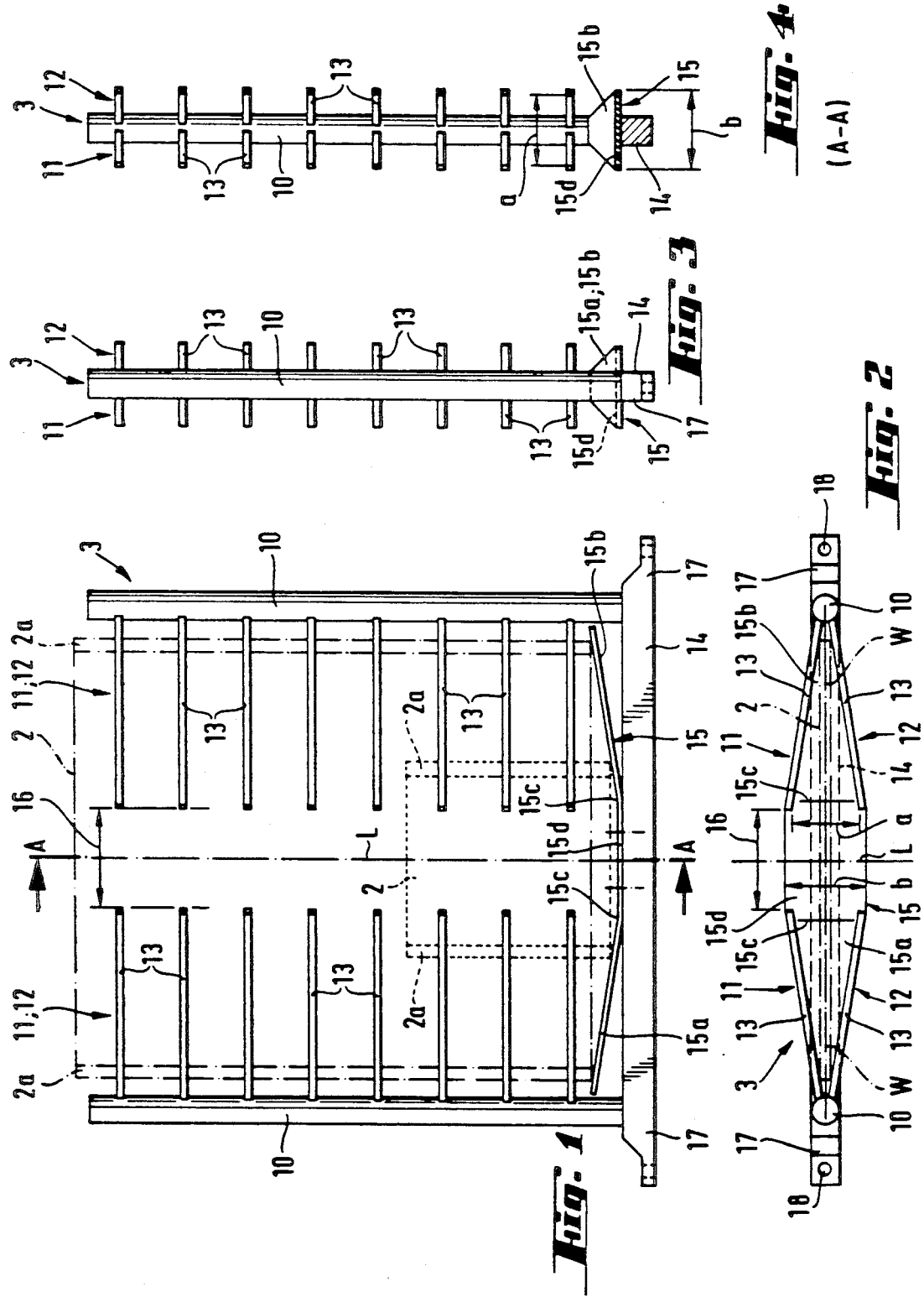

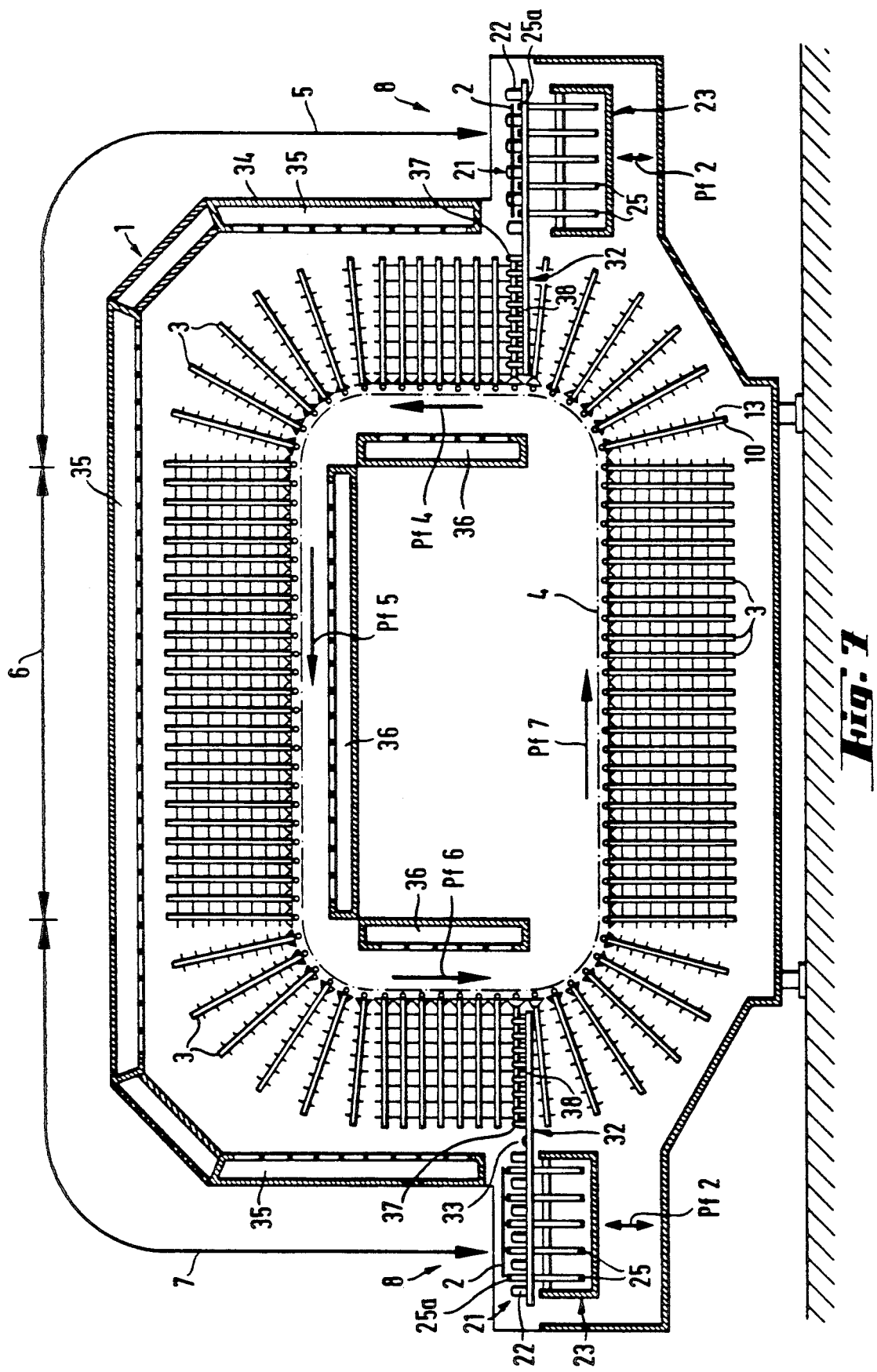

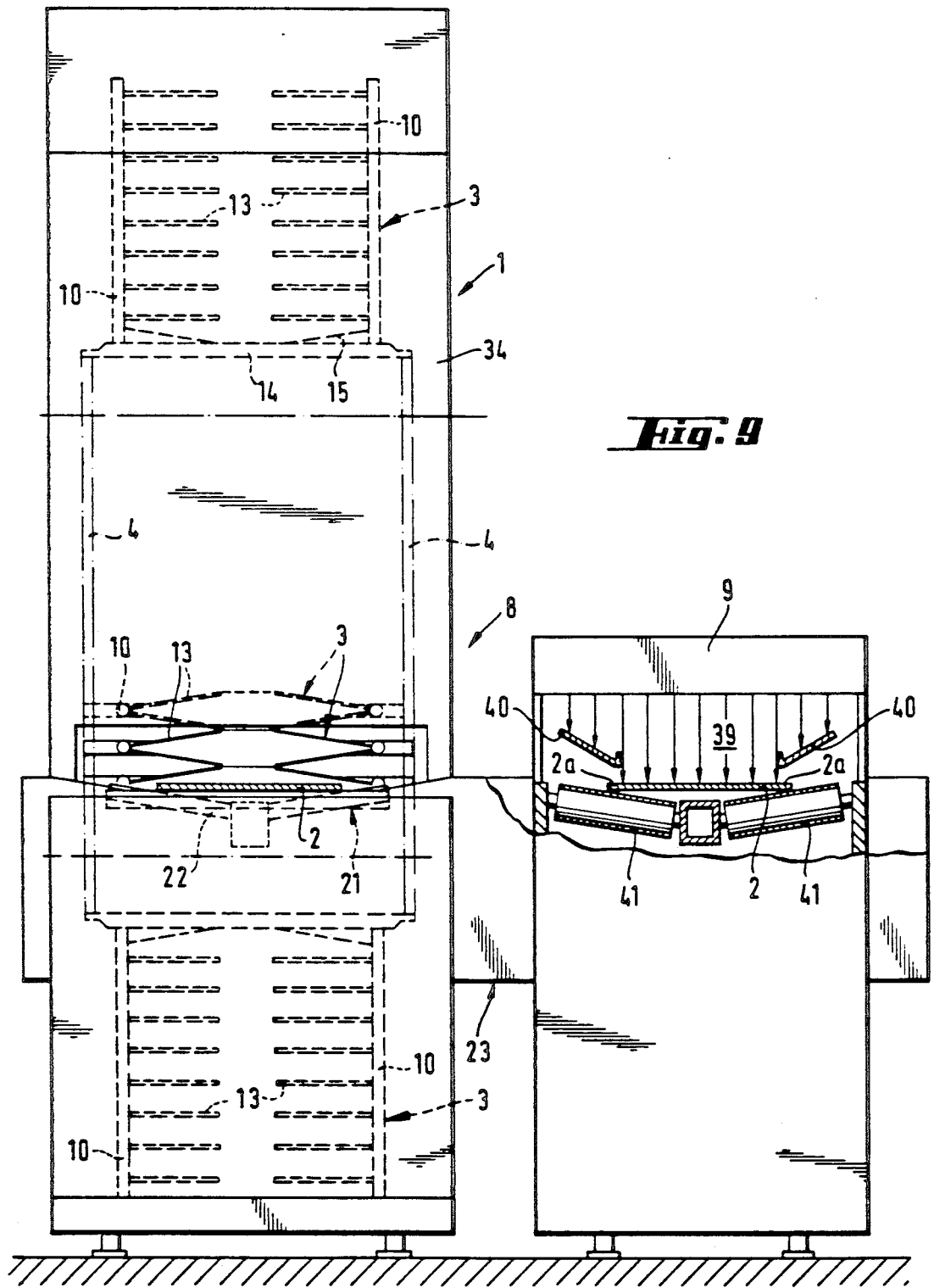

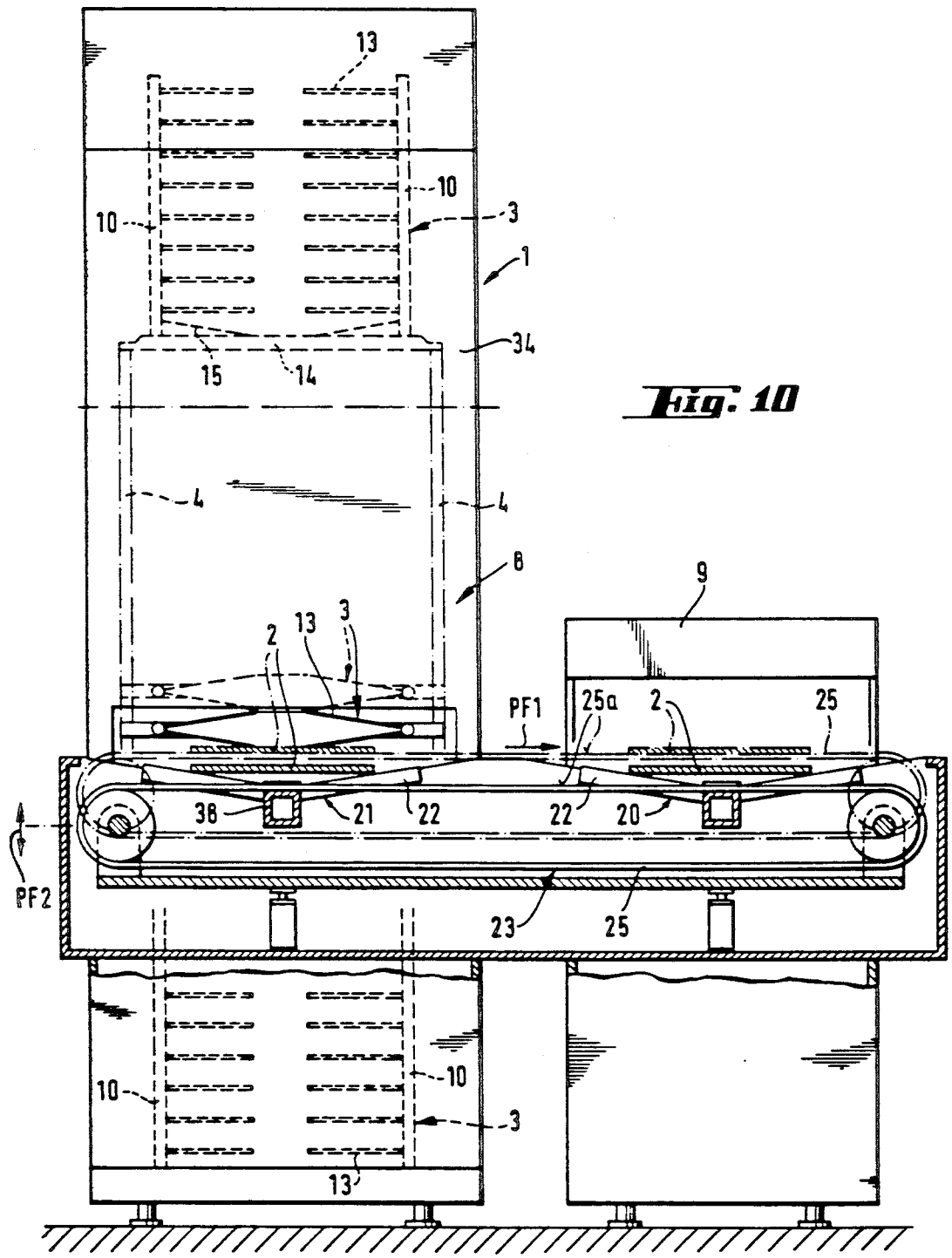

TRANSPORT DEVICE FOR BOARDS, ESPECIALLY THOSE HAVING A SENSITIVE SURFACE

The invention relates to a transport device for boards or board-shaped workpieces, especially those having a sensitive surface, preferably for ciruit boards which are coated with plastics material, for example UV-hardenable plastics material, with lacquer or the like and then dried, the device having holders for taking hold of the boards at the edges thereof when they are being handled and advancing means for transporting them to and through treatment stations.

Various devices for holding and transporting boards or board-shaped workpieces which are intended to allow for the surfaces of the boards to be treated with care are known. This is especially necessary when wet-coated circuit boards are to be transported from the coating station to the drying station. Such circuit boards are coated with a protective lacquer which is first of all dried, then exposed and developed at the unexposed areas.

After being coated, such boards must be aired and dried. A further problem here is that normally both surfaces of such a board have to be coated and correspondingly treated, the coating on the first surface not having hardened and being, therefore, susceptible to damage, during the coating of the second surface.

There is known from FR-A-2 439 734 a transport device for circuit boards having printed circuits that has an endless conveyor with a chain drive, wherein the boards in the region of the carrying run of this conveyor element project into slots which are open at the top, so that their surfaces are oriented substantially vertically. Only one longitudinal edge of the boards is held in this case. A conveyor device of that kind would be unsuitable for freshly coated boards since at least some of the coating fluid would run down the surface and could form runs and tears.

There is known from EP-A-312,498 a transport device of the kind mentioned at the beginning in which there are provided as holders grips or clips which have a separably coupled holding element which can be transferred or translocated, together with the board that is being held, at the transitions from one advancing means to another or from one treatment station to another.

Although the boards can thereby be held in a non-damaging manner in a coating-free edge region and are able to remain connected to their holders throughout the entire treatment, high expenditure on machinery and control technology is required in order to ensure continuous operation of a corresponding transport device. In particular, the coating of such boards on both sides requires two lacquering stations arranged in succession between which a separate drying station must be arranged so that the first coating can first achieve a stability sufficient to allow the board to be transported further to the second lacquering station. Furthermore, precautions must be taken to ensure that the holders for the boards can always be coupled on and uncoupled at the right time and, after passing through the entire transport device, transported back to the starting point at the right time in order to be able to receive further boards at that point.

The problem is therefore to provide a transport device of the kind mentioned at the beginning in which the advantage that the holders touch only the uncoated areas of the boards is retained, but the expenditure on construction and production engineering is reduced and also the handling of those holders is simplified, and in which the holders provide the possibility of simplifying the entire transport device and reducing the amount of space that it requires.

The solution to this problem resides substantially in the fact that the holder has at least two parallel bars on each of which there are provided two rows of prongs arranged in the form of a rake, the prongs of the one row of a bar forming an acute angle with those of the second row of that bar and the two rows accordingly being arranged with respect to each other in a "V" shape when viewed in cross-section, and the free ends of the prongs of the one bar pointing approximately towards the free ends of the prongs of the other bar, and that at least over part of the region located between the bars the width of the gap between the rows of prongs which increases towards the longitudinal middle plane between the two parallel bars is greater than the thickness of a board to be held, the two bars have at one of their ends a carrier which holds and connects them and there is arranged on that carrier an end-face stop for boards which has two limbs extending at an obtuse angle to each other approximately from the middle of the carrier towards the bars.

Into such a holder it is possible to insert even a board that has been coated on one side apart from two narrow longitudinal edge regions extending parallel to the bars, without the coating being impaired as a result of the boards' being supported. The use of prongs and two parallel bars that extend from a common carrier allows insertion from that end face of the holder which is opposite the carrier. Lifting and setting down inside the holder is also possible without problems owing to the supporting prongs, since corresponding counter-prongs or other spaced supporting elements can be lowered or raised through the spaces between the prongs. The end-face stop ensures that, even when the holder is moved out of its horizontal position, in which the bars also are arranged horizontally, into a vertical position with the bars oriented upwardly from the carrier, the board can be supported on the limbs of the end-face stop by a coating-free region, namely the forward-most corner on each side which is arranged between the end face of the board and the lacquer-free longitudinal edge region.

This holder and its features accordingly meet all the requirements necessary to enable a board to be easily inserted into the holder and transported inside the holder, even when it has already been coated on both sides, and also to be removed again, without the lacquered middle regions coming into contact with the holder in any way.

The easy insertion and removal of the boards into and from the holder also makes it possible for the holder to remain connected to its advancing means and obviates the need for it to be uncoupled from the transport means and coupled onto the next transport means at the transfer stations, as a result of which the effort required in handling the holders is reduced.

Since, finally, owing to the two rows of prongs the holder can fulfill the corresponding function also when turned through 180°, a board can be transported, as it were, in a circle upward, horizontally and downward again, causing the holder and the board to be turned simultaneously, so that the special form of the holder offers the possibility of transporting a board, after it has left the lacquering station, first of all upward in the manner already described during which it initially remains in a horizontal orientation, so that a first drying operation can be carried out. The board is then turned through a horizontal transport section and a transport section which is oriented downward again, it being possible at the same time to bring the board upstream of the lacquering station in the advancing direction again. It can then be conveyed through the latter for coating of the second surface, so that the entire system requires only a single lacquering station and, at the same time, the length thereof is considerably reduced.

It is especially advantageous if, immediately at or adjacent to a bar, the width of the gap between the respective rows of prongs arranged in a "V" shape with respect to each other is smaller than the thickness of a board, in a transition region said width is the same as the thickness of a board and, adjacent thereto—closer to the longitudinal middle plane of the holder—said width is greater than the thickness of a board. This ensures that rectangular boards can be inserted in a middle region of the holder without being able to be displaced sideways towards the bars. Even when lateral displacement is possible owing to a relatively small thickness of the board and also in the case of relatively small width of the board, the board is furthermore able to come in contact with the prongs only at its longitudinal edges, so that the surface is not touched and on no account is the region of the surface that is to be coated at a short distance from the side edge touched. In addition, this geometric arrangement provides the possibility of inserting boards of different widths and lengths and also boards of different thicknesses.

The individual prongs of a row are advantageously arranged parallel to one another and at right angles to the bar and in each case two prongs extending at an acute angle approximately from the same point on the bar can lie in a plane arranged at right angles to the length of the bar. Although staggering of the prongs of the two rows of a bar with respect to one another would be conceivable, the above-mentioned construction has the advantage that transport means which are movable upwardly and downwardly between the prongs can in this manner be arranged on both sides in the same manner and at the same place.

The use of the holder also in the turned-over position is facilitated and assisted if the two bars with their rows of prongs arranged in a "V" shape and pointing towards each other are arranged mirror-symmetrically to the longitudinal middle plane extending between the bars. By this means the bisectors of the acute angles formed in each case by the prongs of the one bar advantageously coincide with those of the angles formed by the prongs of the other bar, so that a symmetry with respect to a plane defined by those bisectors also is ultimately produced.

The bisectors may lie in a common plane with the bars, to which plane the longitudinal middle plane is arranged at a right angle.

In order that the insertion and removal of the boards in the holder can be carried out as simply as possible, the space between prongs arranged adjacent to one another in a row may be greater than the lateral extent of those prongs, for example from five to ten times, especially seven or eight times, the diameter or width of the prongs.

Between the free ends of the prongs of a holder, which prongs lie opposite each other preferably exactly in a common plane, a gap may be provided which is smaller than the smallest width of a circuit board and the size of this gap may preferably be approximately from one sixth to one quarter, especially one fifth, of the distance between the two parallel bars. On the one hand, the boards are thereby held sufficiently securely at their edges but, on the other hand, a transferring means can be inserted into the holder, the prongs or—in the case of a roller conveyor which is yet to be described—the rollers of which transferring means are held by a carrier which fits through this gap between the prongs of the holder.

For adaptation to different board sizes, the spacing of the bars of the holder from each other may be adjustable.

Claims 10 to 13 relate to constructions of the end-face stop on which a board can be supported when the bars of the holder are inclined or arranged vertically upward, which is important during a transport circuit. In particular, those features and measures also provide a geometrical adaptation of the end-face stop and its limbs to the profile or cross-sectional shape of the holder formed by the prongs. This on the one hand ensures that a board cannot slip out at that end face even when the holder and its bars are in a vertical orientation, but nevertheless avoids the end-face stop staying, in the region of the bars, at the greatest width that is required at the free ends of the prongs pointing towards one another.

The carrier may project at both sides beyond the two parallel bars extending away from it, that is to say may continue beyond the fastening points of the bars, and have, especially in the region of the projection, fastening or coupling points, for example holes, for connection to advancing means for transporting the holders and the boards. These fastening points are consequently located at a relatively great distance from each other, which also contributes to a stable fixing of the holder to a corresponding advancing means.

As the advancing means for a plurality of holders arranged thereon at constant intervals there may be provided an endlessly circulating pulling element, that is to say an element that transmits forces in the pulling direction but does not absorb forces or absorbs them only to a limited extent in the pressing direction, preferably chains, belts or the like, to the length and direction of movement of which the bars of the holders project outwardly approximately at a right angle, the free ends of the bars remote from the carrier pointing away from the pulling elements or chains. This makes it possible for the boards to be easily supplied and removed especially when the pulling element adopts a vertical position and accordingly the holder and its bars adopt a horizontal position.

In order to enable the holders to remain on their advancing element, that is to say to enable them to continue to travel without any problems on the lower run of the advancing element without the boards falling out there, and in order especially that the boards may, if desired, be coated on both sides, one construction of the device mentioned at the beginning, which merits protection in its own right, provides that laterally of and in a horizontal direction transversely to the advancing direction there is arranged beside the endlessly circulating advancing means with holders fastened or coupled thereto a coating or lacquering station and, in each transport region of the circulating advancing means having a vertical advancing direction, as already indicated as a possibility above, there are provided transfer stations, preferably roller conveyors having pairs of drivable rollers arranged in a "V" shape with respect to each other for removing the boards from the holders and, outside the region through which the holders pass, transverse conveyors with which the boards or circuit boards can be moved to the side and fed to the coating or lacquering station and, after being coated or lacquered, can be fed in the opposite direction to a transfer station and there to a holder. From the preceding description of the holder itself and from the features mentioned above there is therefore produced altogether a device in which a single coating station can be charged more than once with the same boards, it being possible for the latter to be repeatedly removed from a holder, coated and returned to a holder of the advancing means. This is assisted by the fact that removal from and insertion into the holder are very simple since the spaces between the prongs allow comparable forks or rollers having spaces between them to be introduced into the holder easily. The "V" shape of the roller arrangement results in the boards' being touched only at the outsides of their longitudinal edges when on those transferring means also.

As transverse conveyors—for bridging the lateral offsetting of the lacquering station with respect to the endlessly circulating advancing means—there may be provided transversely conveying lifting belts which fit between the rollers of the roller conveyors and, in the spaces between the rollers, can be lowered below the level of the rollers and raised above the level of the rollers, the carrying run of which lifting belts extends as far as between the rollers of a further roller conveyor which is arranged upstream and/or downstream of the lacquering station. Once again, therefore, there is utilised in this transverse conveyor the concept of the boards resting on individual elements, in this case rollers of a roller conveyor, which have spaces between them, this having the advantage in the case of the roller conveyor that first of all it fits between the prongs of the holder but then, outside the region of the holder, also enables transverse conveyor belts to be accommodated.

If it is not desirable for transverse conveyor belts to act on the boards over the entire width thereof, in this situation on the underside thereof, a modified construction can make provision for there to be provided as transverse conveyors lifting and swivelling rakes which fit with their prongs between the individual rollers of the roller conveyors at the transfer station and the lacquering station and which, arranged on a lifting column located between those two parallel roller conveyors, can be lowered below the level of the rollers and raised above the level of the rollers and turned, in the raised position, through at least 180° about a vertical axis, and for the prongs to be curved in concave manner or bent at an obtuse angle in their longitudinal direction, so that in their overall length they have a shape similar to that of the prongs of the holder which are arranged opposite each other with their ends pointing towards each other. Accordingly, on this swivelling rake also, a board will in each case rest only by the outsides of its longitudinal edges.

The lifting and swivelling rake may also be a double rake, in which prongs project from a carrying profile, arranged on the lifting and swivelling column, towards the two opposite sides thereof in, preferably, symmetrical arrangement and extend into the spaces between the rollers of the roller conveyors. To effect transfer, therefore, the swivelling rake needs to be turned through 180° only once after which it is again ready for the next transfer operation without having to be turned or swivelled back.

The rollers which are in each case inclined at an obtuse angle to each other in the shape of a "V" within the roller conveyors can be mounted on a correspondingly "V"-shaped axle or on axle pieces arranged in a "V" shape, it being possible for one of the two rollers to be driven and for the other to be coupled to the driven roller in the direction of rotation via a flexible connecting element, especially a helical spring. In this manner, the rollers of a pair of rollers which are inclined with respect to each other in the shape of a "V" can both be set in rotation by one drive in order to be able to move a board held from below out of a holder or into a holder.

The angle of inclination of the transport rollers which are arranged in a "V" shape and of the prongs of the lifting and swivelling rake and the angle of inclination of the prongs which extend towards each other from the two bars especially in a straight line may approximately coincide with one another, so that a board transported and treated in the device encounters similar supporting conditions at all these elements.

It is advantageous for the advancing element to be movable in steps and for one holder to be arranged in each case in the transfer station to the lacquering station and the transfer station back from the lacquering station, in the region of the delivery and supply roller conveyors, it being possible for the insertion and discharge means to be stationary and constant with regard to their level. As a result, the delivery and take-up at the two stations can take place virtually simultaneously. While the downwardly leading run places the board located in the holder on the roller conveyor for removal from the holder, a further, empty holder reaches the transfer station from below through the spaces between the roller conveyor, its prongs passing through the spaces between the rollers, and is able to lift up a board conveyed thereto and take it along the further transport path.

It would be conceivable to apply further layers using the device according to the invention after both sides of the board have been coated if, for example, more than one layer were required on one or more of the sides of the board. Normally, however, only a single coating of each side of the board is desired after which the board is intended to leave the transport cycle. In order to make this substantially automatic, one construction of the invention may comprise additionally arranging at the transfer station to the lacquering station a discharging device for coated boards and preferably a sensing device, especially an optical sensing device, which activates the unloading or discharging device when a board has been coated on both sides and which activates the transfer device to the lacquering station when the board has been coated on one side. This can be accomplished in a simple manner by providing that the transverse conveyor, that is to say the transversely conveying lifting belts or the swivelling rake, remains inoperative upon determining that a board has been coated on both sides, so that the roller conveyor leading away from the advancing means for the holders can simply convey the board further. If not, the drive of that roller conveyor is shut down when the board has reached the region of the transverse conveyor in order then to be transferred to the roller conveyor upstream of the lacquering station.

The transport path of the boards away from the lacquering station and back to the lacquering station and the turning-over of the board which occurs along that path is at the same time utilised to dry the fresh coating to the extent that it can no longer be damaged.

For that purpose, provision is advantageously made for that region of the advancing element which leads upward, especially vertically upward, and is located downstream of the lacquering station in the direction of transport, to have an air supply and extractor device for airing and pre-drying the coated boards.

Part of the transport path of the advancing element may be constructed as a drying station, preferably that part of the advancing means which follows the upwardly oriented part and which is movable especially horizontally and counter to the direction of transport in the lacquering station. In that region, the holders and the boards held therein are approximately vertical, which does not result in any damage, however, since pre-drying has taken place beforehand.

That part of the advancing element which follows the drying station in the direction of transport and which preferably leads downward again, especially vertically downward, to the discharge station and transfer station can be constructed as a cooling and after-drying section at the end of which the removal device and, optionally, the sensor are arranged.

The holders of the advancing element on the lower run thereof, which is located between the downwardly oriented transport section and the upwardly oriented transport section and is movable parallel to the transport path in the lacquering station, are therefore empty, since the boards have already been removed before the turn into that lower run and are re-inserted only after the further turn.

Further claims relate to further constructions of the device, especially also of the lacquering station and its transport means for moving the boards through the lacquering station at the appropriate speed which is matched to the stepwise advancing speed of the advancing means.

Two embodiments of a device according to the invention are described in detail below with reference to the drawings, some of which are schematic views and in which:

BRIEF DESCRIPTION OF THE DRAWINGS

FIG. 1 shows a view of a holder which has two parallel bars extending from a common carrier and having rows of supporting prongs for rectangular boards, which rows point towards each other, FIG. 2 shows an end view of the holder according to FIG. 1, looking towards the end faces of the bars and the rows of prongs, in each case arranged in a "V" shape, on those bars, FIG. 3 shows a side view of a carrier according to FIG. 1 and FIG. 4 shows a section through the longitudinal middle plane of the holder along the line A—A in FIG. 1, FIG. 7 shows a side view of the endless transport means fitted with holders according to FIGS. 1 to 4, and the discharge and insertion means which are arranged at the same height at two opposite points in the lower region of vertical transport sections, FIG. 8 shows a side view of the lacquering station corresponding to FIG. 7 and the transport device having the circulating advancing means and the holders, which transport device is arranged behind the lacquering station when viewed from this point, FIG. 9 shows an end view of the entire device including the lacquering station, FIG. 10 shows a view, corresponding to FIG. 9, of a transverse conveyor for transferring the workpieces into the lacquering station after removal thereof from the drying station.

Figure 5:
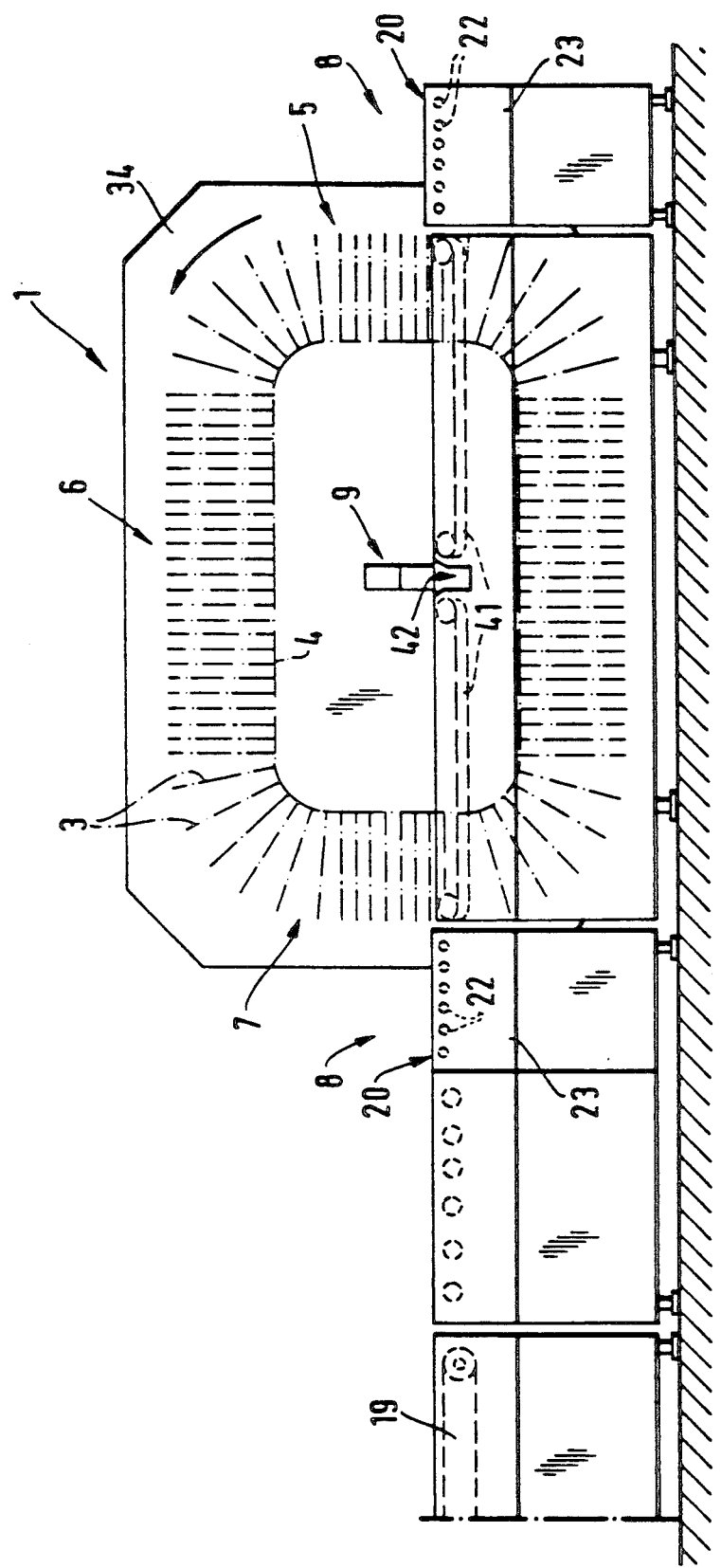
FIG. 5 shows a side view of a transport device for boards using the holder according to FIGS. 1 to 4 with an endlessly circulating advancing means on which holders according to FIGS. 1 to 4 are arranged one after another in the advancing direction, a lacquering station being arranged parallel to the lower run of the advancing means having the holders.

A transport device for boards 2 or board-shaped workpieces, especially those having a sensitive surface, for example for circuit boards which are to be coated with plastics material or lacquer and then dried, which transport device is designated 1 overall and is shown extensively especially in each of FIGS. 5 to 12, has as the essential elements especially the holders 3, shown in FIGS. 1 to 4, for taking hold of the boards 2 at the edges thereof when they are being handled, and various advancing means, especially a pulling element which has the holders 3 permanently attached to it, in the embodiment an endlessly circulating chain 4, for transporting the holders 3 and the boards 2, with which elements the latter can be conveyed through various treatment stations which are yet to be described, such as a pre-drying station 5, a drying station 6 and a cooling station 7. The device 1 additionally comprises advancing or transport means to be described in more detail hereinbelow which are located at transfer stations 8 and also, especially, the lacquering station 9 which serves to carry out the coating and lacquering.

In order that the boards 2 cannot be damaged on their sensitive surface when handled, especially after one coating, the construction of the holder 3 is of fundamental importance in many respects. On the one hand, when the boards are being held in the holder 3, they should not be touched on the coated surface but, on the other hand, it must be possible to transfer them out of and into the holders 3 without problems in order to be able to change at the transfer stations 8 to the lacquering station 9 and back again without problems.

For that purpose, provision is made according to FIGS. 1 to 4 for the holder 3 to have two parallel bars 10 on each of which two rows 11 and 12 of prongs 13 arranged in the form of a rake are provided. As shown in FIG. 2, the prongs 13 of the one row 11 of a bar 10 form an acute angle with those of the second row 12, that is to say, viewed in cross-section, the two rows 11 and 12 are arranged with respect to each other in a "V" shape. The free ends of the prongs 13 of the one bar 10 point towards the free ends of the prongs 13 of the other bar 10, as will again be seen clearly in FIG. 2. The width of the gap between the two rows 11 and 12 of prongs belonging to one bar 10, therefore, increases towards the longitudinal middle plane, indicated in FIGS. 1 and 2 as a dot-dash line L, between the two bars 10.

A board 2 is indicated by dashed lines in FIGS. 1 and 2, FIG. 1 also showing the lacquer-free edges 2a extending parallel to the bars. FIG. 1 shows with a dashed line a very small board 2 that can be taken hold of by a holder 3 and, with a dot-dash line, a very large board 2. It becomes clear in FIG. 2 that, over a large part of the region located between the bars 10, the width of the gap between the rows 11 and 12 of prongs which increases towards the longitudinal middle plane L is greater than the thickness of the boards 2 to be held, with the result that the surfaces of those boards 2, even when resting loosely on the prongs 13, are not touched.

It will also be seen in FIGS. 1 to 4 that the two bars 10 have at one of their ends a carrier 14 which holds and connects them, and that there is provided on that carrier 14 an end-face stop 15 for boards 2 which has two limbs 15a and 15b extending at an obtuse angle to each other approximately from the middle of the carrier 14 towards the bars 10. From FIG. 1 it will be seen that, as a result, the boards 2 come into contact with that stop 15 and the limbs 15a and 15b thereof only at those corners at the transition from their end faces to the longitudinal side faces at which the lacquer-free edges 2a end, so that a plate 2 is free from lacquer at all the points that come into contact with parts of the holder 3 even when, during transport of the boards 2, the holder 3 moves from a horizontal orientation shown in FIG. 2 into a vertical position shown in FIG. 1 and then into a turned-over, further horizontal position whilst a board 2 held therein is turned over at the same time.

Immediately at or adjacent to bar 10, the width of the gap between the respective rows 11 and 12 of prongs arranged in a "V" shape with respect to each other is smaller than the thickness of the board, at a transition point, namely the point of contact of the board 2 with the prongs 13 indicated in FIG. 2, said width is the same as the thickness of the board and, adjacent thereto— closer to the longitudinal middle plane L of the holder 3 —said width is greater than the thickness of the board. It is not imperative, however, for a board 2 to touch the prongs 13 of both rows 11 and 12 with its longitudinal edges at the same time as shown in FIG. 2 for the largest possible board 2, but a smaller board will in each case touch only the lower prongs 13 of a holder 3.

The prongs 13 of a row 11 and 12 are arranged parallel to one another and at right angles to the bar 10, and in each case two prongs 13 extending at an acute angle approximately from the same point on the bar 10 lie in a plane arranged at right angles to the length of the bars 10 and also at right angles to the longitudinal middle plane L, as is clear especially from FIGS. 3 and 4. The two bars 10 with their rows 11 and 12 of prongs 13 arranged in a "V" shape and pointing towards each other are arranged mirror-symmetrically to the longitudinal middle plane L extending between the bars 10, so that the supporting of a board 2 on the holder is always the same irrespective of the orientation of the holder. Accordingly, the transport means, which are yet to be described, for transferring the boards at the transfer stations 8 can also correspond to each other.

In FIG. 2 it will also be seen that the bisectors W of the acute angles formed in each case by the prongs 13 of the one bar 10, which prongs are straight in the embodiment, coincide with those of the angles formed by the prongs 13 of the other bar 10. Both bisectors W continue in a straight line, so that all the bisectors W of the acute angles formed in each case by the prongs 13 of the bars 10 lie in a common plane with the bars 10, which plane is intersected by the longitudinal middle plane L and to which plane that longitudinal middle plane L is arranged at a right angle.

The space between the prongs 13 arranged adjacent to one another in a row is greater than the lateral extent of those prongs and is, for example, from five to ten times, especially seven or eight times, the diameter or width of a prong. As mentioned, in the embodiment the prongs 13 are straight, but it is also possible for them to be curved, the curvature thereof advantageously lying in the plane which is shown in plan view in FIG. 2.

Between the free ends of the prongs 13 of a holder 3, which prongs lie opposite each other preferably exactly in a common plane, a gap 16 is provided (cf. FIG. 1) which is smaller than the smallest width of a board or circuit board 2 that is to be held. The size of this gap 16 is preferably from one sixth to one quarter, especially one fifth, of the distance between the two parallel bars 10. In a manner yet to be described, a carrier for prongs or rollers projecting laterally from the carrier can be moved through this gap 16 in order to lift up the board 2 lying on the prongs 13 of the holder 3 and remove it from the holder or put it down in the holder after inserting it therein. For this purpose, in a manner not shown in detail, the spacing of the bars 10 from each other and therewith also the gap 16 can be adjustable. This allows adaptation to boards 2 that differ from each other in their dimensions even more widely than do those shown in FIG. 1.

According to FIG. 1, the limbs 15a and 15b of the end-face stop 15 form an obtuse angle with each other, there being provided, however, between the two points 15c at which the limbs 15a and 15b each extend from the carrier 14 at an acute angle, preferably a straight-line connection 15d of the limbs 15a and 15b which is approximately of a length approximately corresponding to the spacing or the size of the gap 16 between the free ends of the prongs 13 or, as shown in FIG. 2, slightly exceeding it and which is smaller than the width of the smallest board to be held. Thus, as little as possible of the overall length of the holder 3 is occupied by the limbs 15a and 15b inclined with respect to the carrier 14.

It should be mentioned at this point that the carrier 14 could itself be shaped in such a manner that it has stop regions for the boards 2 corresponding to the limbs 15a and 15b, that is to say itself forms the stop 15.

FIGS. 2 to 4 show that the end-face stop 15 has, in the region of the carrier 14, and hence also of the gap 16, a greater width b transversely to the plane defined by the carrier 14 and the bars 10, in which the bisectors W also lie, than do the carrier 14 and the bars 10, and its width corresponds approximately to the spacing a at the free ends of the prongs 13 of two rows 11 and 12 of prongs of a bar 10, which prongs extend away from each other in a "V" shape. In FIG. 2 it will be seen that the width be even exceeds the spacing a by the cross-sectional dimensions of the prongs 13, so that an altogether coherent profile is produced.

This width b of the end-face stop 15 and, at the same time, according to FIG. 2, the width of the limbs 15a and 15b which are at an obtuse angle to each other steadily decreases according to FIG. 2 towards the bars 10, namely in the shape of or at the angle at which the prongs 13 are arranged with respect to each other in a "V" shape, so that the end-face stop 15 terminates the projection of the rows 11 and 12 of the prongs 13 at the end face in front of or at the carrier 14 and the edges of the limbs 15a and 15b of the end-face stop 15 each extend approximately in the plane formed by the prongs 13 of a row 11 or 12. In spite of the great number of individual parts, the holder 3 thus retains overall a substantially continuous peripheral surface.

According to FIGS. 1 and 2, the carrier 14 projects at both sides beyond the fastening points of the two parallel bars 10 extending away from it and has, in the region of those projections 17, fastening or coupling points, holes 18 in the embodiment, for connection to advancing means, in the present case the circulating chain 4, for transporting the holders 3 and the boards 2.

Figure 6:
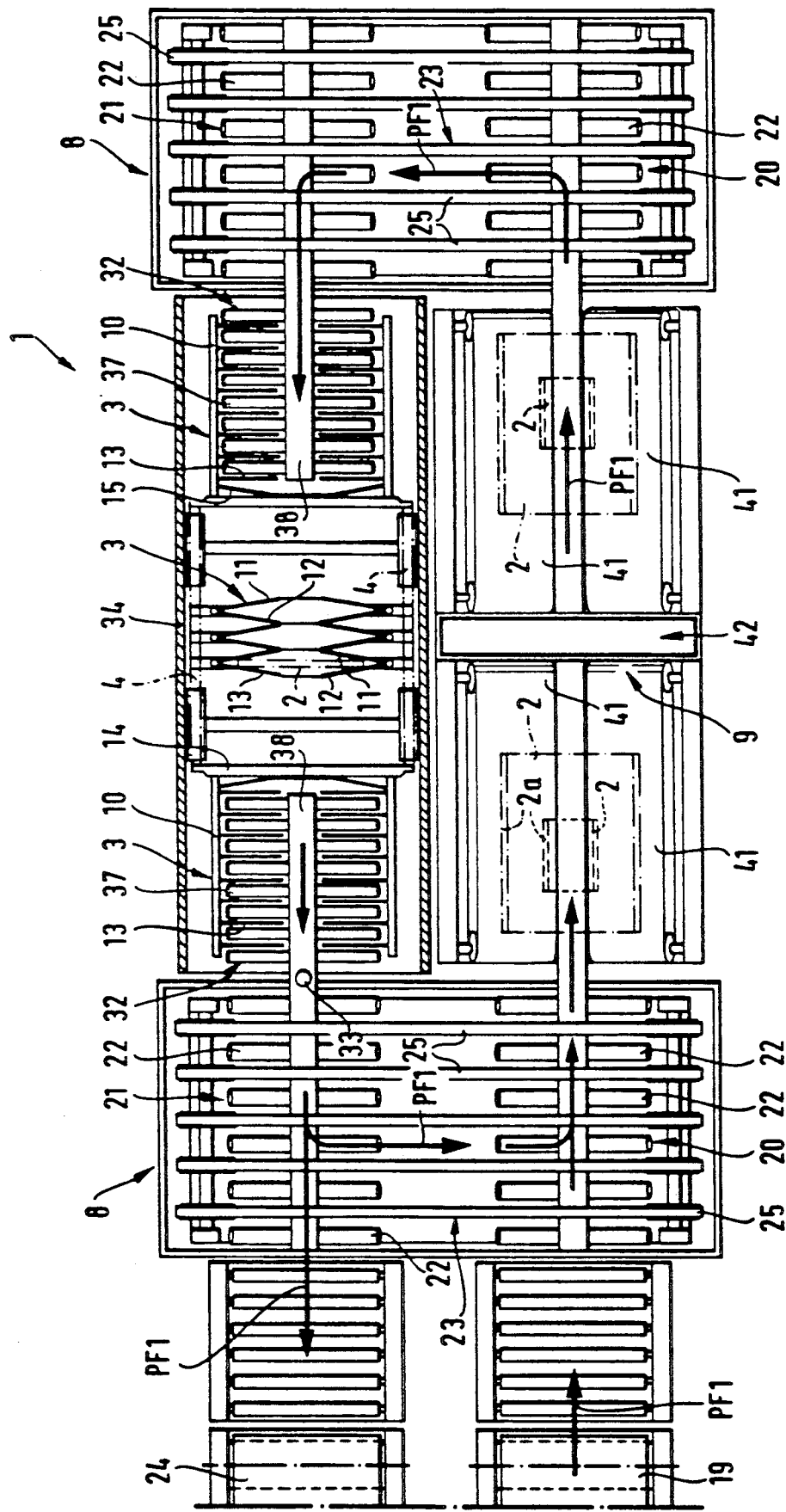
FIG. 6 shows an enlarged plan view of the transport device according to FIG. 5 having holders arranged on an endlessly circulating advancing means, transfer stations and connection means for transferring the boards to the transport section running through the lacquering station, on the one hand, and for returning the boards again to the advancing means having holders according to FIGS. 1 to 4.
Figure 6:
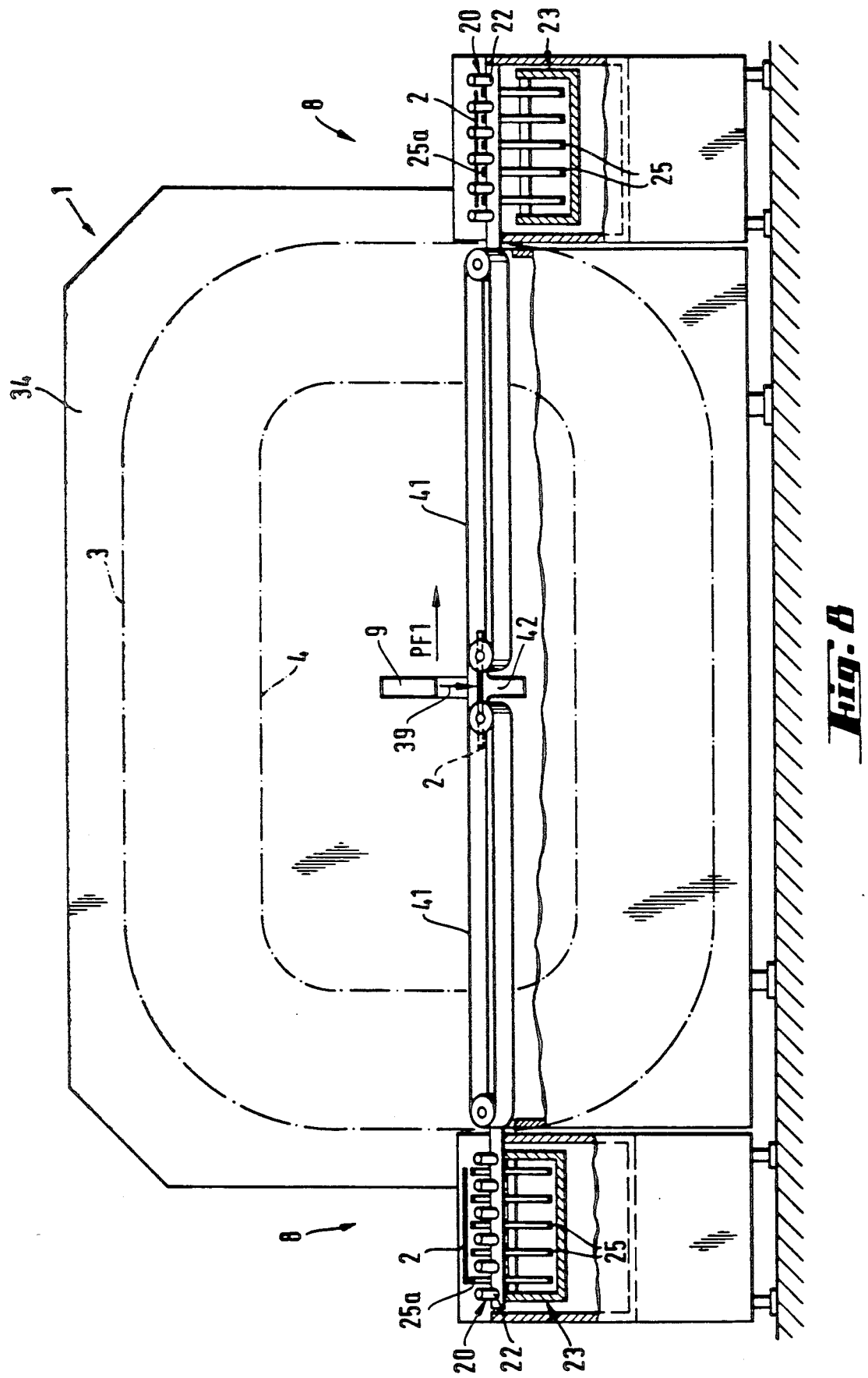
Figure 11:
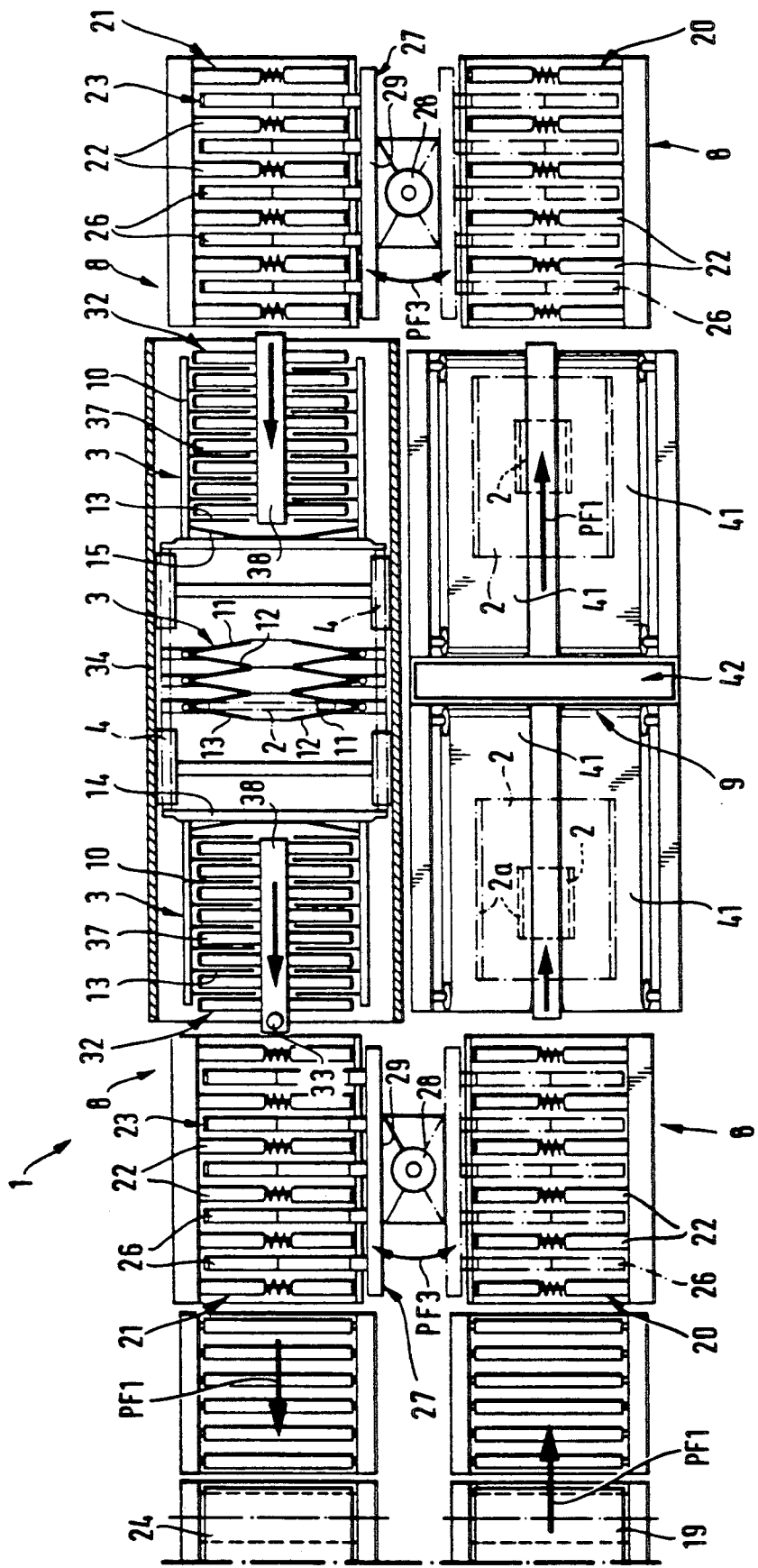
FIG. 11 shows a view, corresponding to FIG. 6, of modified means for transferring the workpieces from the drying station to the lacquering station and back again, namely by means of a lifting and swivelling rake which can be swivelled about a vertical axis.

As already mentioned and shown clearly especially in FIG. 7 but also in FIGS. 6 and 11, there is provided as the advancing means for a plurality of holders 3 arranged thereon at constant intervals an endlessly circulating pulling element which, therefore, is able to transmit forces in the pulling direction but is unable or hardly able to do so transversely thereto or in the pressing direction, this advancing means being in the case of the embodiment the chain 4 which has already been mentioned. Correspondingly stable belts, cables or the like are also possible. It becomes clear especially in FIG. 7 that the bars 10 of the holders 3 project outwardly approximately at a right angle to the length and direction of movement of the chain 4, the free ends of the bars 10 remote from the carrier 14 pointing away from the chains 4. Thus, the holders 3 and their bars 10 are able to move at the turn-round points from their otherwise parallel position with respect to each other into an angled position relative to each other without any problem, that is to say are able to go with the turn, and furthermore the holders 3 are in this manner especially easily accessible for the loading and unloading of boards 2.

FIG. 5 shows schematically an overall side view of the device 1. A loading device 19 is able to bring the boards 2 to a first roller conveyor 20 from which they can be fed to the actual treatment.

In FIGS. 6, 9, 10, 11 and 12 it will be seen in the device 1 that laterally of or in a horizontal direction transversely to the advancing direction of the endlessly circulating advancing means, that is to say the chain 4, with the holders 3 fastened or coupled thereto there is arranged beside that chain 4 with the holders 3 the coating or lacquering station 9 and that, in each transport region of the circulating chain 4 having a vertical advancing direction, there are provided the transfer stations 8, in the embodiment roller conveyors 21 having pairs of drivable rollers 22 arranged in a "V" shape with respect to each other for removing the boards 2 from the holders 3 and, outside the region through which the holders 3 pass, transverse conveyors designated 23 overall. With the latter, the boards 2 can be moved to the side and thus fed to the coating or lacquering station 9, as indicated by arrows in FIG. 6 from the top and also in FIG. 10 and, in addition, in FIGS. 11 and 12. In FIGS. 6 and 11 it will also be seen that, after coating or lacquering, the boards 2 can be fed in the opposite direction to the second transfer station 8 and then to a holder 3 on the chain 4 again. In FIGS. 6 and 10 on the one hand and FIGS. 11 and 12 on the other hand, two different constructions of transverse conveyors 23 are shown. These transverse conveyors 23 take the boards 2 removed from holders 3 from the roller conveyor 21 to the roller conveyor 20, which also adjoins the loading device 19, if a board 2 is to receive a second coating in a manner yet to be described. Downstream of the lacquering station 9 in the transport direction the transverse conveyors 23 convey the boards 2 to the holders 3 on the chain 4 whereupon they are able to pass to the roller conveyor 21 again and, if necessary, also to an unloading device 24, as will be explained in detail hereinbelow.

In the embodiment shown in FIGS. 6 and 10 there are provided as transverse conveyors 23 transversely conveying lifting belts 25 which fit between the rollers 22 of the roller conveyors 20 and 21 and, in the spaces, can be lowered below the level of the rollers and raised above the level of the rollers (cf. FIG. 10), the upper carrying run 25a of which lifting belts extends as far as between the rollers of the roller conveyor 20 arranged upstream or downstream of the coating station 9 as the case may be. It becomes clear especially from FIG. 6 that the length of the lifting belts 25 and their carrying run 25a is such that, after leaving a holder 3, a board 2 can be taken out of alignment with the latter transversely into the transport section of the lacquering station 9 and, after passing through the latter, transversely back into alignment with a holder 3 again. This transverse transport is indicated in FIGS. 6 and 10 by the arrows Pf 1. FIG. 10 also illustrates by means of the double arrow Pf 2 the height adjustability of the lifting belts 25, the lifting belt 25 shown schematically in FIG. 10 being in the upper position whilst its position when lowered below the roller conveyors 20 and 21 is shown by a dot-dash line.

These lifting belts are also shown schematically in FIGS. 7 and 8, some of them being in the upper position—the lifting belts on the left before the entry to the lacquering station as viewed by the observer—and some of them being in the lowered position—the lifting belts 25 on the right downstream of the lacquering station 9 in the advancing direction as viewed by the observer—, it becoming quite clear how these lifting belts 25 can be raised and lowered in the spaces between the rollers 22 and thereby take the boards 2 from the rollers 22 or place them thereon.

Figure 12:
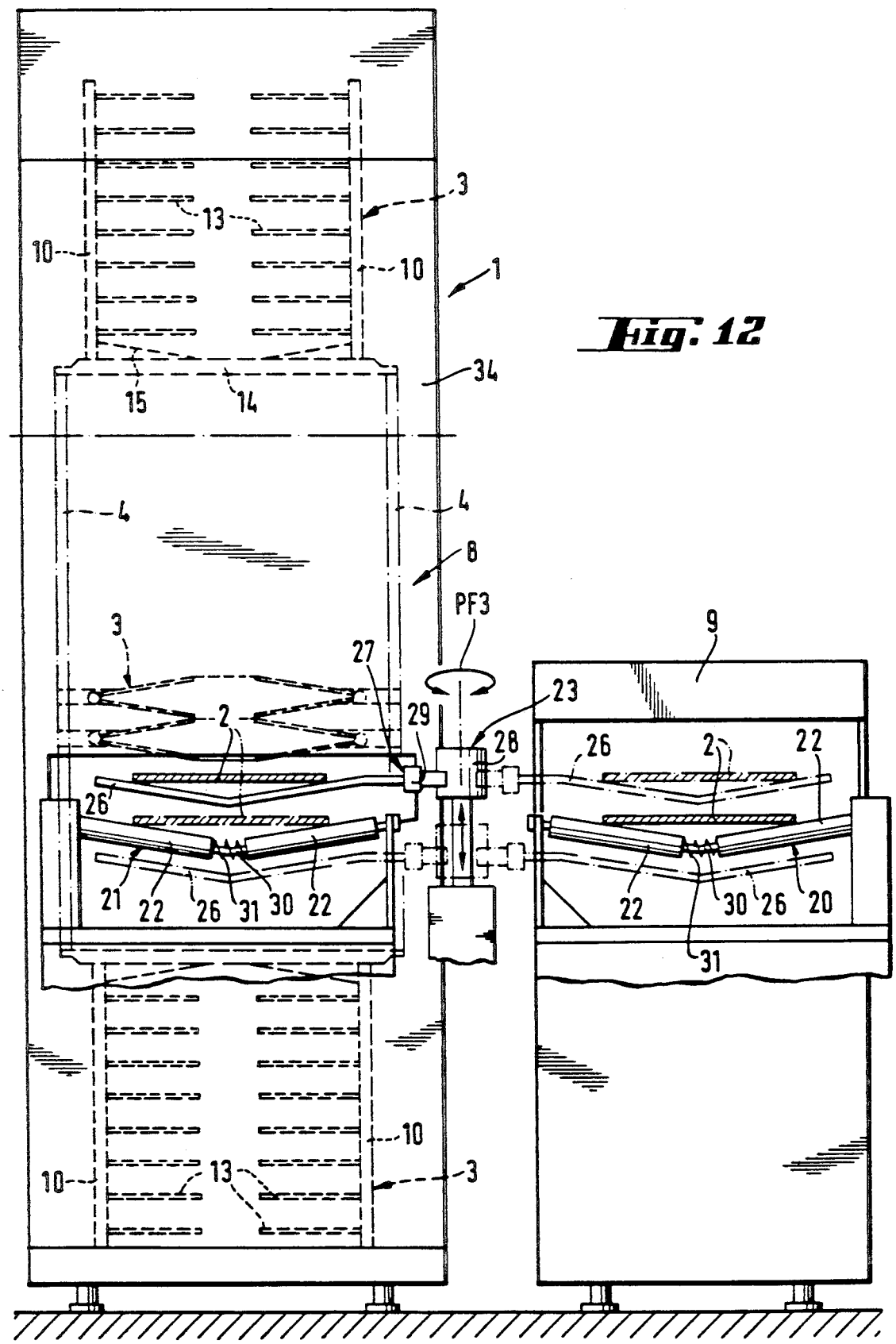
FIG. 12 shows a view, corresponding to FIG. 10, of the embodiment having the lifting and swivelling rake.
Figure 13:
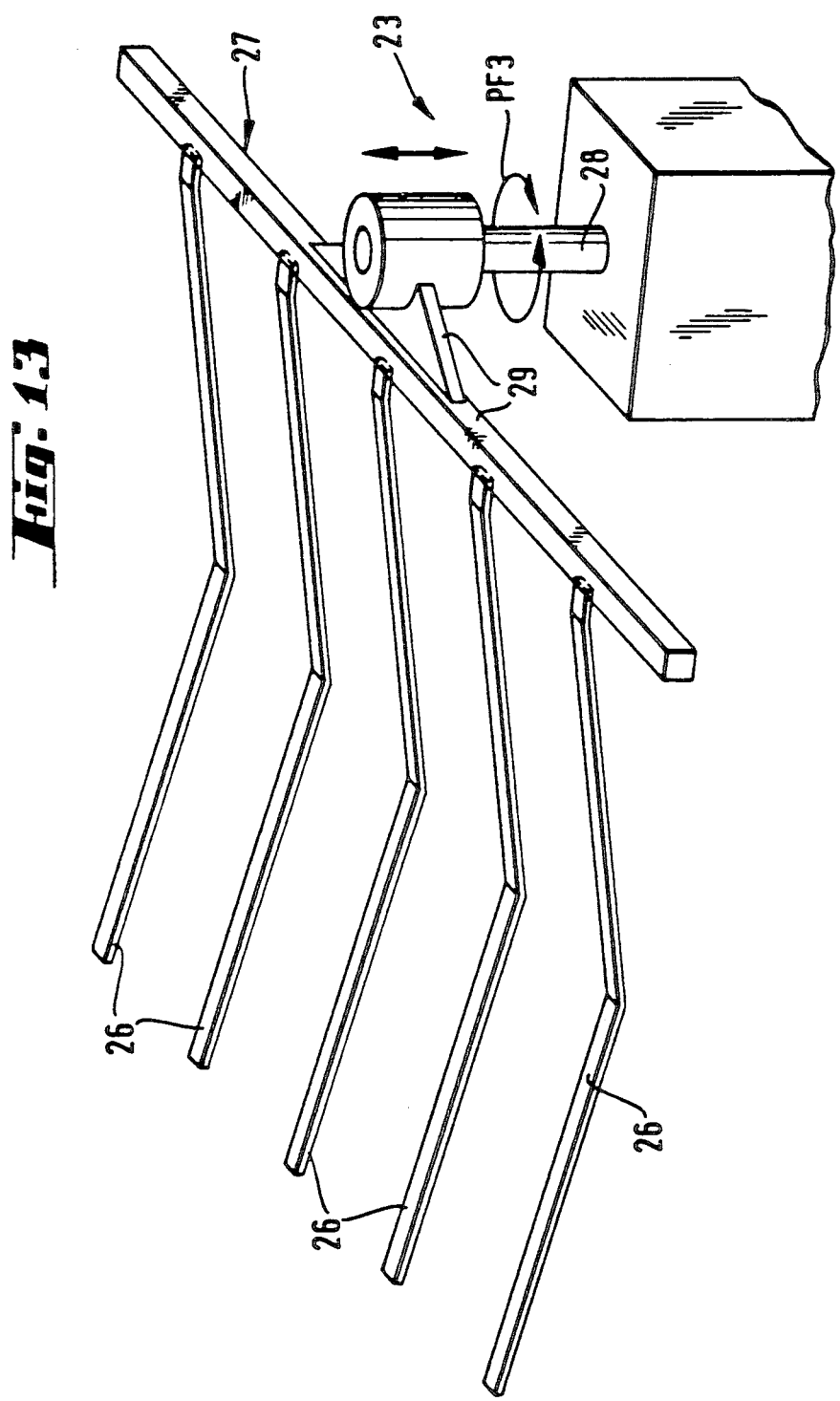
FIG. 13 shows an enlarged view of the lifting and swivelling rake together with the drive thereof.

A modified construction of the transverse conveyors 23 is shown in FIGS. 11 to 13. In this case there are provided as transverse conveyors 23 lifting and swivelling rakes 27 which fit with their prongs 26 between the individual rollers 22 of the roller conveyors 20 and 21 at the transfer station 8 and the lacquering station 9 and which, arranged on a lifting column 28 located between those two roller conveyors 20 and 21, can be lowered below the level of the rollers 22 and raised above the level thereof and turned, in the raised position, according to the curved double arrow Pf 3 in FIGS. 11 to 13, through at least 180° about a vertical axis, the axis of the lifting column 28. FIG. 13 especially shows that the prongs 26 are bent approximately at their middle at an obtuse angle, that is to say they form an obtuse "V" that corresponds to the "V" formed by the rollers 22 of each pair of rollers of the roller conveyors 20 and 21 with each other and which also corresponds to the arrangement of the prongs 13 of the holders 3. The prongs 26 could alternatively be curved in a concave manner, however. A board 2 could thus come to rest thereon in the manner indicated in FIG. 12 and in so doing touch the prongs 26 only with the lacquer-free edge region 2a.

In FIG. 13, a single lifting and swivelling rake 27 of that kind is shown. It could also be a double rake, however, in which prongs 26 project from a carrying profile 29, arranged on the lifting swivelling column, towards the two opposite sides thereof in symmetrical arrangement and extend into and fit in the spaces between the rollers 22 of the roller conveyors 20 and 21. For every transfer of boards, therefore, such a double rake would need to be turned through 180° only in one direction to be immediately in the position of use again.

Figure 14:
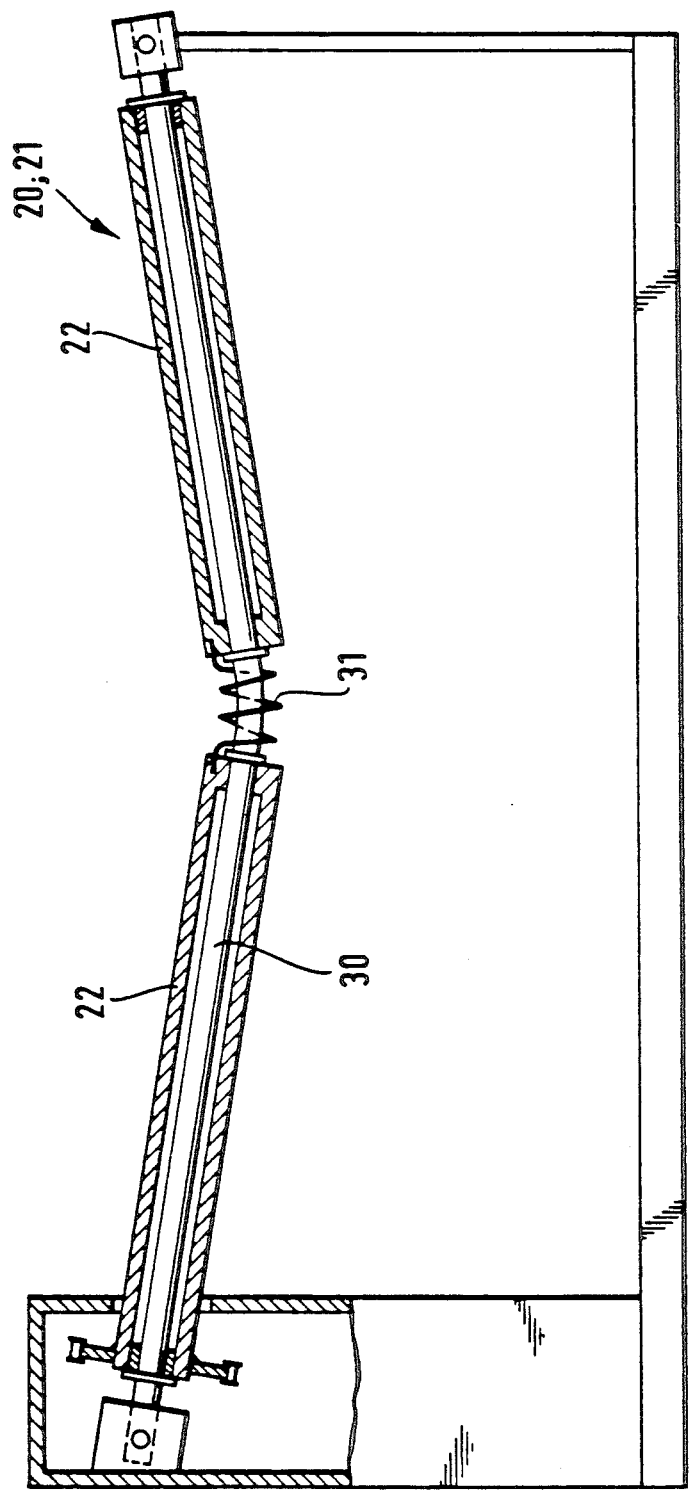
FIG. 14 shows a separate view of the arrangement of two rollers arranged at an obtuse angle to each other in the shape of a "V", together with their common drive and a connecting spring for transmitting the rotary drive of the one roller to the second roller.

It has already been mentioned that the rollers 22 are arranged at an obtuse angle in a "V" shape with respect to each other. FIG. 14 indicates that these rollers 22 which are in each case inclined with respect to each other in the shape of "V" within the roller conveyors 20 and 21 are mounted on an axle 30 which is correspondingly bent or curved in a "V" shape, one of the two rollers being driven and the other being coupled to the driven roller in the direction of rotation by a flexible connecting element, in FIG. 14 a helical spring 31, so that, in spite of their "V"-shaped arrangement, both rollers 22 require only one drive and can be set in rotation synchronously. It would also be conceivable, however, to mount the rollers 22 on a flexible shaft which is in turn driven or to provide, for each of the rollers inclined with respect to the other, separate, synchronous drives.

It becomes clear especially from FIG. 12 that the angle of inclination of the transport rollers 22 which are arranged in a "V" shape and of the prongs 26 away from their bending point and the angle of inclination of the prongs 13 of the holders 3, which prongs extend towards each other from the two bars 10 especially in a straight line, approximately coincide with one another.

The chain 4 forming the advancing element is movable in steps in the direction of the arrows Pf 4, Pf 5, Pf 6 and Pf 7 shown in FIG. 7. It also becomes clear in FIG. 7 that in each case one holder 3 is arranged in the transfer station 8 to the lacquering station 9 and one holder 3 is arranged in the opposite transfer station 8 back from the lacquering station 9, in the region of and at the height of the delivery and supply roller conveyor 21, the insertion and discharge means 32, which are yet to be described, being stationary and constant with regard to their level and arranged to engage in the profile of those holders 3, or in those holders 3.

FIGS. 6 and 11 show that at the transfer station 8 to the lacquering station 9 there are arranged in alignment with the roller conveyor 21 the unloading device 24 for coated boards 2 and also a sensing device 33, especially an optical sensing device 33. The sensing device 33 activates the unloading device 24 and the roller conveyor 21 leading thereto when a board 2 has been coated on both sides; it activates the transverse conveyor 23 to the lacquering station 9 when the board 2 has been coated on only one side but is to be coated on both of its faces.

The chain 4 with the holders 3 is arranged inside a housing 34. The region of the advancing element that leads upward, in the embodiment vertically upward according to the arrow Pf 4, and is located downstream of the lacquering station in the direction of transport has, inside that housing 34, air supply and extractor devices, namely air supply channels 35 and exhaust air extractors 36 for airing and pre-drying the coated boards 2. It will be seen in FIG. 7 that the air supply channels 35 are arranged on the outside of the holders 3 which point towards them and the exhaust air extractors 36 are arranged at the opposite end of the holders in the interior space surrounded by the chain 4, so that the airing and drying air is supplied approximately parallel to the surfaces of the boards 2 in this transport region.

Part of the transport path of the chain 4 is constructed as a drying station 6, this being in the embodiment shown in FIG. 7 that part of the chain 4 which follows the upwardly oriented part of the transport path and which is movable especially horizontally according to the arrow Pf 5 in FIG. 7 counter to the direction of transport in the lacquering station 9. In that region, the holders 3 and therewith also the boards 2 are oriented approximately vertically upward and the boards 2 are supported inside the holders 3 on the stops 15 and the limbs 15a and 15b thereof.

That part of the chain 4, or of the path of the chain 4 inside the housing 34, which follows the drying station 6 in the direction of transport according to the arrow Pf 6 and which leads downward again, that is to say vertically downward, to the transfer station 8 is constructed as a cooling and after-drying section or station 7 at the end of which the removal or discharge means 32 and the sensor 33 are arranged. Below the discharge means 32, the holders 3 on the chain 4 between the downwardly oriented transport section and the upwardly oriented transport section, in the lower run located there which is movable parallel to the transport path in the lacquering station 9 are empty. Owing to this overall arrangement, the holders 3 may be relatively simple in construction since the boards 2 rest in these holders only when the holders also have a horizontal or upwardly oriented position, with the result that there is no need for any non-positive clips or the like for fixing the boards 2 inside the holders 3.

As will be seen especially in FIGS. 6 and 11, but is also indicated in FIG. 7, there is provided as the insertion and discharge means 32 a stationary engaging roller conveyor which engages between the rows of prongs 13 of the holder 3 located at a transfer station 8 and transports in the horizontal direction and has driven rollers 37 preferably inclined at an obtuse angle to each other, these rollers 37 being arranged as the case may be below or above the lateral spaces between individual adjacent prongs 13 of the holder 3, and a central roller carrier 38 from which the axes of the rollers 37 and accordingly also the rollers 37 themselves project on both sides, as the case may be below or above the gap 16 present in the holders 3 between the free ends of the prongs 13. As a result, it is possible to move the holders 3 in the vertical direction from the top to the bottom according to the arrow Pf 6 or, according to the arrow Pf 4, from the bottom to the top in comb-like manner through the engaging roller conveyor and, in the downward movement, to place a board 2 located between the prongs 13 onto the engaging roller conveyor or, as they pass from the bottom to the top, to take a board arriving from the transfer station 8 and lying on the engaging roller conveyor in the direction of the arrow Pf 4. These insertion and discharge means 32 in the form of the engaging roller conveyor thus make the final connection between the circulating chain 4 having the holders 3 on the one hand and the transfer stations 8 and the lacquering station 9 and close the entire transport path of the boards 2.

In FIG. 9 it is indicated that the lacquer-pouring curtain 39 or the lacquer-spraying region of the lacquering station 9 is narrower than the respective region of the board 2 to be coated so that a lacquer-free edge 2a is produced. For that reason, the board 2 is preferably screened from the supply of lacquer, for example by deflection plates 40, at those edges 2a which are located at both sides in the direction of transport. This ensures that the lacquer-free edges 2a, which serve to be placed on the rollers arranged in a "V" shape and the correspondingly arranged prongs, are produced.

FIGS. 5, 6, 8 and 11 show a schematic view of the lacquering station 9. It will especially be seen that it has two conveyor belts 41 for transporting the board 2 through the lacquering station 9, which conveyor belts are interrupted in the region of a pouring curtain or a spray-pouring device and continue in the direction of transport. The excess lacquer is able to run off at the interruption 42. Roller conveyors also could optionally be employed.

The two conveyor belts 41 of the lacquering station 9 are divided in the longitudinal direction and their parallel halves are arranged at an obtuse angle to each other in a "V" shape as shown in FIGS. 10 and 12. The "V" angle of the parallel halves of the conveyor belts 41 of the lacquering station 9 may correspond to that of the feed roller conveyor and of the prongs 26 of the swivelling rake 27 and preferably to the angle between each of the prongs 13 of the holder 3 that point towards each other, so that the board 2 encounters the same supporting and bearing conditions here also.

In summary, the above-described system and device operates as follows:

The transport device 1 is altogether a circulating coating system which is provided primarily for coating circuit boards on both sides, which circuit boards are turned, after a first coating, through 180° and, in addition, aired, dried and cooled. In order to decide and to detect whether a circuit board 2 has been coated on one side or on both sides and therefore is to be fed to the lacquering station 9 again or discharged via the unloading device 24, the sensing device 33 is arranged at the outlet of the cooling station 7.

The transport of the boards 2 through the entire device 1 is effected in steps. In order to treat the coating on the circuit board with as great a care as possible once it has been applied, the boards 2 are to be in contact with the various transport means, especially the rollers 22 of the roller conveyors 20 and 21 and conveyor belts 41 and also the prongs 13 and 26, only at their outer longitudinal edges 2a, for which reason all of these means are in each case arranged at an obtuse angle to each other in the shape of a "V". Only the rollers or belts located immediately adjacent to the loading device 19 or immediately before the unloading device 24 can be arranged substantially horizontally.

Owing to the above-described arrangement of the holders 3 on the chain 4, which circulates through the pre-drying station 5, drying station 6 and cooling station 7, each holder 3 can be stepped at the entry side into a position in which its upper prongs 13 are located above, and the lower prongs 13 are located below, the rollers 37 of the insertion means 32, which rollers 37 are arranged in a "V" shape. The circuit board 2 can then be inserted and, in the next step, lifted up by the insertion means 32, whereupon the next holder 3 reaches the insertion position. This relates to the transfer station 8 between the lacquering station 9 and the pre-drying station 5.

In order to remove the circuit boards 2, at the exit side the holders 3 are in each case stepped into a position (transfer station 8 arranged on the left-hand side in FIG. 7) in which the circuit boards 2 rest on the "V" rollers 37 of the discharge means 32. The upper "V" limbs of the holder 3, however, still do not touch the surface of the circuit board. In this process, the prongs 13 that are then at the bottom are those which were at the top at the previous transfer station 8. The rollers 37 are then driven thereby transporting the circuit board 2 out of the holder 3. Thereafter the holders 3 are stepped a further step so that the next circuit board can be removed and the next circuit board can be supplied at the opposite side. The insertion and the removal of the circuit boards 2 thus takes place in the same operating step.

Upon passing the sensing device 33 at the transfer station 8 arranged at the end of the cooling station 7, a decision is made in each case as to whether the circuit board 2 will be fed again to the lacquering station 9 by means of the transverse conveyor 23 or discharged.

Altogether there is thus obtained a transport device 1 having a lacquering station 9 in which boards 2 can be handled with care, in which, owing especially to the construction of the holder 3, the latter is able to receive the circuit board after a first coating operation, and transport, hold and turn it during airing, drying and cooling and from which the board can be removed again without problems and without endangering the surface coating and, if necessary, fed again to the lacquering station 9. Since the boards 2 rest loosely in the holders 3 owing to the special construction thereof, thus experiencing only edge contact and accordingly, especially in the case of prongs of round cross-section, experiencing only point contact, there is no need to operate any complicated clamps, clips or the like or transfer them when changing the individual operating stations. Since the holders 3 circulate on the chain 4, they automatically execute a turning movement, with the result that it is not necessary to have two lacquering stations with drying devices located between them in order to coat both sides, but both coatings can be applied in one and the same lacquering station and with the aid of only one drying device. Altogether, therefore, owing not least of all to the advantageous construction of the holders 3, the transport device 1 becomes altogether more compact and productive in terms of its expenditure on machinery.

The transport device 1 for boards 2 or board-shaped workpieces, especially those having a sensitive surface, preferably for circuit boards which are coated with plastics material, for example UV-hardenable plastics material, with lacquer or the like and then dried is constructed as a circulating coating system. The device 1 contains especially holders 3 for taking hold of the boards 2 at the edges 2a thereof when they are being handled, and advancing means for transporting those holders 3, which advancing means are advantageously in the form of chains 4. The holder 3 has two parallel bars 10 on each of which two rows 11, 12 of prongs 13 arranged in the form of a rake are provided, the prongs 13 of the one row 11 of a bar 10 forming an acute angle with those of the second row 12 of that bar 10 and the two rows 11 and 12 accordingly being arranged with respect to each other in a "V" shape when viewed in cross-section. The free ends of the prongs 13 of the one bar 10 point towards the free ends of the prongs 13 of the other bar 10. The two bars 10 extend from a common carrier 14 which holds and connects them and on which there is provided at the end from which the bars 10 extend an end-face stop 15 for the boards 2, which stop has two arms 15a, 15b extending at an obtuse angle to each other towards the bars 10, so that a rectangular board being supported abuts only with the corners thereof that are towards that stop 15.

What is claimed is:

1. A transport device (1) for boards (2) or board-shaped workpieces, which are coated with plastics material, and then dried, the device having holders (3) for taking hold of the boards (2) at the edges (2a) thereof when they are being handled and advancing means for transporting them to and through treatment stations, wherein each holder (3) has at least two parallel bars (10) on each of which there are provided two rows (11, 12) of prongs (13) arranged in the form of a rake, the prongs (13) of the one row (11) of a bar (10) forming an acute angle with those of the second row (12) of that bar (10) and the two rows (11, 12) accordingly being arranged with respect to each other in a "V" shape when viewed in cross-section and the free ends of the prongs (13) of the one bar (10) pointing towards the free ends of the prongs (13) of the other bar (10), and wherein at least over part of the region located between the bars (10) the width of the gap between the rows (11, 12) of prongs (13) which increases towards the longitudinal middle plane (L) between the two parallel bars (10) is greater than the thickness of a board (2) to be held, the two bars (10) have at one of their ends a carrier (14) which holds and connects them and there is arranged on that carrier (14) an end-face stop (15) for boards (2) which has two limbs (15a, 15b) extending at an obtuse angle to each other from the middle of the carrier (14) towards the bars (10).

2. A device according to claim 1, wherein immediately at or adjacent to a bar (10) the width of the gap between the respective rows (11, 12) of prongs (13) arranged in a "V" shape with respect to each other is smaller than the thickness of a board, at a transition point said width is the same as the thickness of a board and, adjacent thereto—closer to the longitudinal middle plane (L) of the holder (3)—said width is greater than the thickness of a board.

3. A device according to claim 1, wherein the prongs (13) of a row (11, 12) are arranged parallel to one another and at right angles to the bar (10) and in each case two prongs extending at an acute angle from the same point on the bar (10) lie in a plane arranged at right angles to the length of the bars (10).

4. A device according to claim 1, wherein the two bars (10) with their rows (11, 12) of prongs (13) arranged in a "V" shape and pointing towards each other are arranged mirror-symmetrically to the longitudinal middle plane (L) extending between the bars (10).

5. A device according to claim 1, wherein said prongs are straight and the bisectors (W) of the acute angles formed in each case by the prongs (13) of the one bar (10) coincide with those of the angles formed by the prongs (13) of the other bar (10).

6. A device according to claim 1, wherein the bisectors (W) of the acute angles formed in each case by the prongs (13) of the bars (10) lie in a common plane with the bars (10), to which plane the longitudinal middle plane (L) is arranged at a right angle.

7. A device according to claim 1, wherein the space between prongs (13) arranged adjacent to one another in a row is greater than the lateral extent of those prongs, for example is from five to ten times, the diameter or width of the prongs (13).

8. A device according to claim 1, wherein between the free ends of the prongs (13) of a holder (3), which prongs lie opposite each other in a common plane, a gap (16) is provided which is smaller than the smallest width of a board (2), and the size of this gap (16) is approximately from one sixth to one quarter of the distance between the two parallel bars (10).

9. A device according to claim 8, wherein the size of said gap (16) is one fifth of the distance between the two parallel bars.

10. A device according to claim 8, wherein the limbs (15a, 15b) of the end-face stop (15) form an obtuse angle with each other and there is provided between the two points (15c) at which the limbs (15a, 15b) each extend from the carrier (14) at an acute angle a straight-line connection (15d) of the two limbs (15a, 15b) which is of a length corresponding to or exceeding the gap between the free ends of the prongs (13) and which is smaller than the width of the smallest board to be held.

11. A device according to claim 1, wherein there is provided between the carrier (14) and the first prong (13) immediately adjacent thereto a space which corresponds to or is smaller than the spacing between the individual prongs (13), and the limbs (15a, 15b) of the end-face stop (15) end in the region between the carrier (14) and that first prong (13), in the middle of that space and, at the same time, touch the bar (10) and are connected thereto.

12. A device according to claim 1, wherein the end-face stop (15) has, in the region of the carrier (14), a greater width (b) transversely to the plane defined by the carrier (14) and the bars (10) than do the carrier (14) and the bars (10), and its width corresponds to the spacing (a) at the free ends of the prongs (13) of two rows (11, 12) of prongs of a bar (10), which prongs extend away from each other in a "V" shape.

13. A device according to claim 12, wherein the width (b) of the end-face stop (15) and the width of the limbs (15a, 15b) which are at an obtuse angle to each other decreases towards the bars (10), at the angle at which the prongs (13) are arranged with respect to each other in a "V" shape, so that the end-face stop (15) terminates the projection of the rows (11, 12) of the prongs (13) at the end face in front of the carrier (14) and the edges of the limbs (15a, 15b) of the end-face stop (15) each extend approximately in the plane formed by the prongs (13) of a row (11, 12).

14. A device according to claim 1, wherein there is provided as the advancing means for a plurality of holders (3) arranged thereon at constant intervals an endlessly circulating pulling element, to the length and direction of movement of which the bars (10) of the holders (3) project outwardly at a right angle, the free ends of the bars (10) remote from the carrier (14) pointing away from the pulling elements (4).

15. A device according to claim 14, wherein laterally of and in a horizontal direction transversely to the advancing direction there is arranged beside the endlessly circulating advancing means with the holders (3) fastened or coupled thereto a coating or lacquering station (9) and, in each transport region of the circulating advancing means having a vertical advancing direction, there are provided transfer stations (8) having means for removing the boards (2) from the holders (3) and, outside the region through which the holders (3) pass, transverse conveyors (23) with which the boards (2) or circuit boards can be moved to the side and fed to the coating or lacquering station (9) and, after being coated or lacquered, can be fed in the opposite direction to a transfer station (8) and there to a holder (3) and which comprises insertion and discharge means (32) for the boards (2).

16. A device according to claim 15, wherein said transfer stations (8) are roller conveyors (21) having pairs of drivable rollers (22) arranged in a "V" shape with respect to each other"

17. A device according to claim 16, wherein there are provided as transverse conveyors (23) transversely conveying lifting belts (25) which fit between the rollers (22) of the roller conveyors (20, 21) and, in the spaces, can be lowered below the level of the rollers and raised above the level of the rollers, the carrying run (25a) of which lifting belts extends as far as between the rollers of a roller conveyor (20) arranged upstream and/or downstream of the lacquering station (9).

18. A device according to claim 16, wherein there are provided as transverse conveyors (23) lifting and swivelling rakes (27) which fit with their prongs (26) between the individual rollers (22) of the roller conveyors (20, 21) at the transfer station (8) and the lacquering station (9) and which, arranged on a lifting column (28) located between those two parallel roller conveyors (20, 21), can be lowered below the level of the rollers (22) and raised above the level of the rollers and turned, in the raised position, through at least 180° about a vertical axis, and the prongs (26) are bent at an obtuse angle in their longitudinal direction.

19. A device according to claim 18, wherein the lifting and swiveling rake (27) is a double rake in which prongs (26) project from a carrying profile (29), arranged on the lifting and swivelling column (28), towards the two opposite sides thereof in symmetrical arrangement and extend into the spaces between the rollers (22) of the roller conveyors (20, 21).

20. A device according to claim 16, wherein the rollers (22) which are in each case inclined with respect to each other in the shape of a "V" within the roller conveyors (20, 21) are mounted on a correspondingly "V"-shaped axle (30), one of the two rollers is driven and the other is coupled to the driven roller in the direction of rotation via a flexible connecting element.

21. A device according to claim 16, wherein the angle of inclination of the transport rollers (22) which are arranged in a "V" shape and of the prongs (26) of the lifting and swivelling rake and the angle of inclination of the prongs (13) which extend towards each other from the two bars (10) in a straight line coincide with one another.

22. A device according to claim 16, wherein the advancing element, especially the chain (4), is movable in steps and one holder (3) is arranged in each case in the transfer station (8) to the lacquering station (9) and the transfer station (8) back from the lacquering station (9), in the region of the delivery and supply roller conveyor (21), the insertion and discharge means (32) being stationary and constant with regard to their level.

23. A device according to claim 15, wherein at the transfer station (8) to the lacquering station (9) there are arranged the unloading device (24) for coated boards (2) and an optical sensing device (33), which activates the unloading device (24) when a board (2) has been coated on both sides and activates the transverse conveyor (23) to the lacquering station (9) when the board (2) has been coated on one side.

24. A device according to claim 15, wherein that region of the advancing element which leads upward, and is located downstream of the lacquering station (9) in the direction of transport has an air supply and extractor device for airing and pre-drying the coated boards (2).

25. A device according to claim 15, wherein part of the transport path of the advancing element is constructed as a drying station, that part of the advancing means which follows the upwardly oriented part and which is movable horizontally and counter to the direction of transport in the lacquering station (9).

26. A device according to claim 25, wherein that part of the advancing element which follows the drying station (6) in the direction of transport and which leads downward again, to the transfer station (8) is constructed as a cooling and after-drying section (7) at the end of which the removal and discharge means (32) and, optionally, the sensor (33) are arranged.

27. A device according to claim 26, wherein the holders (3) of the advancing element on the lower run thereof, which is located between the downwardly oriented transport section and the upwardly oriented transport section and which is movable parallel to the transport path in the lacquering station (9), are empty.

28. A device according to claim 15, wherein there is provided as the insertion and discharge means (32) for the boards a stationary engaging roller conveyor which engages between the rows of prongs (13) of the holder (3) and transports in the horizontal direction and has driven rollers (37) inclined at an obtuse angle to each other, the rollers being arranged as the case may be below or above the lateral spaces between individual adjacent prongs (13) of the holder (3), and a central roller carrier (38) being arranged as the case may be below or above the gap (16) in the holders (3) between the free ends of the prongs (13), so that the holders (3) can be moved in the vertical direction from the top to the bottom or from the bottom to the top in comb-like manner through the engaging roller conveyor and, in their downward movement, place a board (2) located between the prongs (13) onto the engaging roller conveyor or, as they pass from the bottom to the top, take a board (2) lying on the engaging roller conveyor with them.

29. A device according to claim 15, wherein a lacquer-pouring curtain (39) or a lacquer-spraying region is utilized in the lacquering station (9) and is narrower than the respective region of the board (2) that is to be coated and the board (2) is screened from the supply of lacquer at those edges (2a) which are located at both sides in the direction of transport.

30. A device according to claim 15, wherein the lacquering station has two roller conveyors or conveyor belts (41) for transporting the board (2) through the lacquering station (9), which said roller conveyors or conveyor belts are interrupted in the region of the pouring curtain or a spray-pouring device and continue in the direction of transport.

31. A device according to claim 15, wherein the rollers of the roller conveyor or the two conveyor belts (41) of the lacquering station (9) are divided in the longitudinal direction and their parallel halves are arranged at an obtuse angle to each other in a "V" shape.

32. A device according to claim 31, wherein the "V" angle of the parallel halves of the conveyors (41) of the lacquering station (9) corresponds to that of the feed roller conveyor and of the prongs (26) of the swivelling rake (27) and to the angle between each of the prongs (13) of the holder (3) that point towards each other.

33. A device according to claim 32, wherein said plastics material is a lacquer.

34. A device according to claim 14, wherein said pulling elements are chains.

35. A device according to claim 14, wherein said pulling elements are belts.

36. A device according to claim 1, wherein said boards or board-shaped workpieces are circuit boards.

37. A device according to claim 1, wherein said plastics material is UV-hardenable.

38. A device according to claim 1, wherein the spacing of the bars (10) is adjustable.

39. A device according to claim 1, wherein the carrier (14) projects at both sides beyond the two parallel bars (10) extending away from it and has, in the region of the projection (17), fastening or coupling points, for example holes (18), for connection to advancing means for transporting the holders (3) and the boards (2).

* * * * *